US011610754B2

(12) United States Patent
Takaguchi et al.

(10) Patent No.: US 11,610,754 B2
(45) Date of Patent: Mar. 21, 2023

(54) CHARGED PARTICLE BEAM DEVICE

(71) Applicant: Hitachi High-Tech Corporation, Tokyo (JP)

(72) Inventors: Katsura Takaguchi, Tokyo (JP); Yohei Nakamura, Tokyo (JP); Masahiro Sasajima, Tokyo (JP); Toshihide Agemura, Tokyo (JP); Natsuki Tsuno, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 187 days.

(21) Appl. No.: 17/294,468

(22) PCT Filed: Dec. 6, 2018

(86) PCT No.: PCT/JP2018/044976
§ 371 (c)(1),
(2) Date: May 17, 2021

(87) PCT Pub. No.: WO2020/115876
PCT Pub. Date: Jun. 11, 2020

(65) Prior Publication Data
US 2022/0013326 A1    Jan. 13, 2022

(51) Int. Cl.
*H01J 37/22* (2006.01)
*H01J 37/244* (2006.01)
*H01J 37/28* (2006.01)

(52) U.S. Cl.
CPC .......... *H01J 37/222* (2013.01); *H01J 37/226* (2013.01); *H01J 37/244* (2013.01); *H01J 37/28* (2013.01);
(Continued)

(58) Field of Classification Search
CPC ...... H01J 37/222; H01J 37/226; H01J 37/244; H01J 37/28; H01J 2237/2448;
(Continued)

(56) References Cited

U.S. PATENT DOCUMENTS 7,364,917 B2 *   4/2008   Ichimura .............. G01N 1/2214
422/50
7,812,614 B2 *  10/2010   Kurita .................... G01N 30/70
324/464

(Continued)

FOREIGN PATENT DOCUMENTS

JP          2009004114 A      1/2009

OTHER PUBLICATIONS

Search Report dated Feb. 19, 2019 in International Application No. PCT/JP2018/044976.
(Continued)

*Primary Examiner* — David A Vanore
(74) *Attorney, Agent, or Firm* — Miles & Stockbridge, P.C.

(57) ABSTRACT

An object of the invention is to provide a charged particle beam device capable of specifying an irradiation position of light on a sample when there is no mechanism for forming an image of backscattered electrons. The charged particle beam device according to the invention determines whether an irradiation position of a primary charged particle beam and an irradiation position of light match based on a difference between a first observation image acquired when the sample is irradiated with only the primary charged particle beam and a second observation image acquired when sample is irradiated with the light in addition to the primary charged particle beam. It is determined whether the irradiation position of the primary charged particle beam and the irradiation position of the light match using the first observation image
(Continued)

and a measurement result by a light amount measuring device.

15 Claims, 11 Drawing Sheets

(52) U.S. Cl.
CPC .................. *H01J 2237/2448* (2013.01); *H01J 2237/24564* (2013.01)

(58) Field of Classification Search
CPC ........... H01J 2237/24564; H01J 37/228; H01J 2237/2482; H01J 37/147
See application file for complete search history.

(56) References Cited

U.S. PATENT DOCUMENTS

| | | | | |
|---|---|---|---|---|
| 8,621,660 B2* | 12/2013 | Watanabe | ............... | G01Q 40/00 850/10 |
| 8,637,819 B2* | 1/2014 | Sato | ...................... | H01J 37/304 250/306 |
| 8,642,980 B2* | 2/2014 | Man | ....................... | H01J 37/023 250/311 |
| 8,813,261 B2* | 8/2014 | Iyoki | ..................... | G01Q 30/18 73/105 |
| 8,822,911 B2* | 9/2014 | Sugiyama | ............. | H01J 37/304 250/252.1 |
| 8,890,093 B2* | 11/2014 | Kozakai | ................. | H01J 37/28 250/397 |
| 8,916,839 B2* | 12/2014 | Suzuki | ..................... | G01N 1/32 250/307 |
| 8,978,479 B2* | 3/2015 | Okubo | ..................... | G01N 3/32 73/788 |
| 9,001,966 B2* | 4/2015 | Matoba | .................. | G01N 23/04 250/442.11 |
| 9,024,280 B2* | 5/2015 | Uemoto | .................... | G01N 1/32 250/307 |
| 9,033,574 B2* | 5/2015 | Nagasawa | ................ | G01N 5/00 374/10 |
| 11,398,367 B2* | 7/2022 | Miwa | .................... | H01J 37/244 |
| 11,410,836 B2* | 8/2022 | Asakura | ............. | H01J 37/3299 |
| 11,417,499 B2* | 8/2022 | Yano | ..................... | H01J 37/261 |
| 11,424,099 B2* | 8/2022 | Kannami | ............ | H01J 37/1474 |
| 11,428,652 B2* | 8/2022 | Irie | ..................... | G01N 23/2251 |
| 11,486,828 B2* | 11/2022 | Horigome | ................. | G01J 3/10 |
| 11,538,656 B2* | 12/2022 | Iwahori | ................... | H01J 37/20 |
| 11,538,657 B2* | 12/2022 | Maeda | .................... | H01J 37/22 |
| 11,538,659 B2* | 12/2022 | Nakamura | .............. | H01J 37/20 |
| 11,545,334 B2* | 1/2023 | Komatsuzaki | ......... | H01J 37/222 |
| 11,545,336 B2* | 1/2023 | Nishihata | .............. | H01J 37/222 |
| 2008/0315093 A1* | 12/2008 | Hasegawa | ............. | H01J 37/026 250/372 |
| 2021/0090853 A1* | 3/2021 | Aso | ........................ | H01J 37/222 |
| 2022/0013326 A1* | 1/2022 | Takaguchi | .............. | H01J 37/28 |
| 2022/0139667 A1* | 5/2022 | Shouji | ................... | H01J 37/244 250/311 |

OTHER PUBLICATIONS

Written Opinion dated Feb. 19, 2019 in International Application No. PCT/JP2018/044976.

* cited by examiner

CHARGED PARTICLE BEAM DEVICE

TECHNICAL FIELD

The present invention relates to a charged particle beam device.

BACKGROUND ART

During processing such as sample observation and analysis using a charged particle beam device, it is known that charging a sample causes fluctuations and distortions in brightness of a secondary charged particle image. Examples of a charge control technique include a method of irradiating an irradiation region of a charged particle beam with an electromagnetic wave such as light. For example, PTL 1 describes a technique of "adding a photoelectron imaging mode by generating ultraviolet irradiation to operation modes of an electron optics system, and displaying an irradiation region of ultraviolet as a photoelectron image and superimposing the photoelectron image and a backscattered electron image on a monitor, a mutual positional relationship and a difference in a size can be easily grasped" (see ABSTRACT).

CITATION LIST

Patent Literature

PTL 1: JP-A-2009-004114

SUMMARY OF INVENTION

Technical Problem

In a charged particle beam device that irradiates a sample with a charged particle beam and light, a unit for specifying an irradiation region of the light is required. This is because if irradiation positions of the charged particle beam and the light are deviated from each other, for example, when charging is inhibited by light irradiation, a region where the charging is not removed may remain.

In PTL 1, an irradiation region of light is specified by forming an image of photoelectrons using a mechanism for forming an image of backscattered electrons. With respect to this, for example, when an inspection device that does not use backscattered electrons such as a scanning electron microscope is used, in order to adopt the method described in PTL 1, it is necessary to separately provide the mechanism for forming an image of backscattered electrons. In other words, PTL 1 does not consider a case of using the inspection device that does not have the mechanism for forming the image of backscattered electrons.

The invention has been made in view of the above problem, and an object thereof is to provide a charged particle beam device capable of specifying an irradiation position of light on a sample when there is no mechanism for forming an image of backscattered electrons.

Solution to Problem

A charged particle beam device according to the invention determines whether an irradiation position of a primary charged particle beam and an irradiation position of light match based on a difference between a first observation image acquired when a sample is irradiated with only the primary charged particle beam and a second observation image acquired when the sample is irradiated with the light in addition to the primary charged particle beam. It is determined whether the irradiation position of the primary charged particle beam and the irradiation position of the light match using the first observation image and a measurement result by a light amount measuring device.

Advantageous Effect

According to the charged particle beam device according to the invention, it is possible to specify the irradiation position of the light on the sample when there is no mechanism for forming an image of backscattered electrons. Therefore, it is possible to match the irradiation position of the primary charged particle beam with the irradiation position of the light without providing a new mechanism for forming an image of backscattered electrons.

DESCRIPTION OF EMBODIMENTS

First Embodiment

Figure 1:
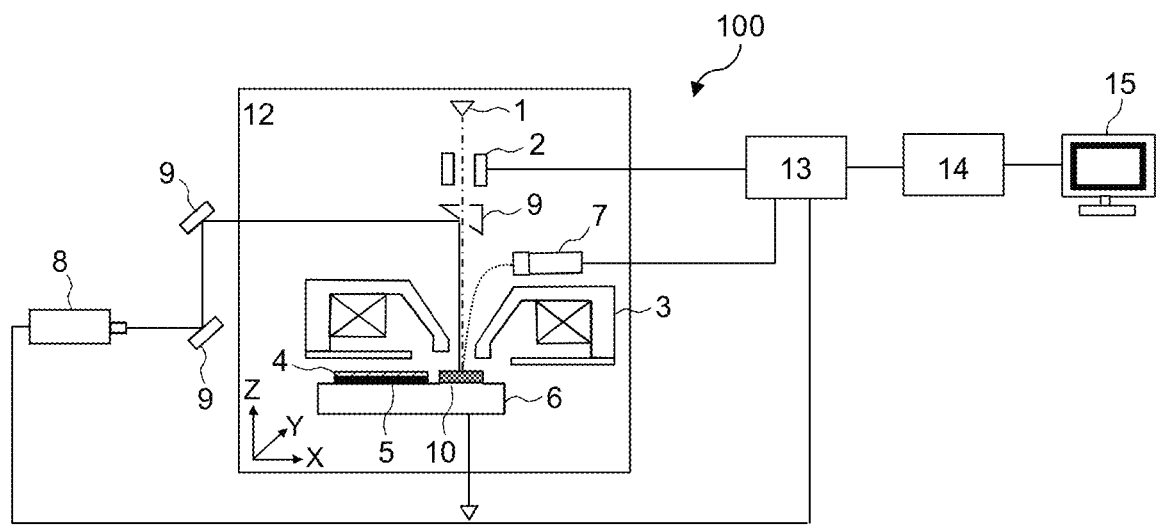
FIG. 1 is a configuration diagram of a charged particle beam device 100 according to a first embodiment.

FIG. 1 is a configuration diagram of a charged particle beam device 100 according to a first embodiment of the invention. The charged particle beam device 100 includes an electron optics system, a light irradiation system, and an image generation system. The electron optics system includes an electron source 1, a deflector 2, an electron lens 3, a sample 4, a sample holder 5, a sample stage 6, and a secondary electron detector 7 arranged in a vacuum chamber 12. The light irradiation system includes a light source 8, adjustment mechanisms 9, and a position adjustment sample 10. The image generation system includes a control unit 13, an image processing unit 14, and an image display unit 15.

A primary electron beam emitted from the electron source 1 is deflected by the deflector 2, converged by the electron lens 3, and scanned on the position adjustment sample 10 mounted on the sample stage 6. When the primary electron beam is irradiated to the position adjustment sample 10, secondary electrons are emitted from the position adjustment sample 10, and the secondary electron detector 7 detects the secondary electrons. The control unit 13 detects a secondary electron signal in synchronization with a scanning signal of the electron beam. The image processing unit 14 generates a secondary electron image, and the image display unit 15 displays the secondary electron image.

An irradiation position of light oscillated from the light source 8 is adjusted by the adjustment mechanism 9 (for example, a mirror or a lens), and the light is irradiated to the sample 4. The light irradiated uses a wavelength range from X-ray to infrared. As the light source 8, a light source having a single wavelength, a light source that selects a specific wavelength of the light source that includes a required wavelength range, or a light source whose wavelength is converted by generating harmonics or the like may be used.

Energy of the used light is preferably in a wavelength range exceeding band gap energy of a measurement sample in order to generate carriers in the sample. However, if the energy of the light exceeds a work function of the sample, photoelectrons are generated from a surface of the sample and contrast of the secondary electron image is reduced, and thus, the energy should not exceed the work function.

The light may be incident perpendicular to the sample as shown in FIG. 1 or may be incident obliquely to the sample. When condensing the light, a parabolic mirror, a toroidal mirror, or a condensing lens is used. At this time, when using a mirror for vertical irradiation, a non-magnetic conductor material that does not affect a trajectory of the electron beam is selected, and a hole having a diameter of approximately the electron beam is provided on the conductor material for the electron beam to pass through. The mirror may be manual or may use a piezo motor or the like capable of fine movement. However, it is necessary to avoid influence on the trajectory of the electron beam by using a material that is not charged even in the hole.

Figure 2:
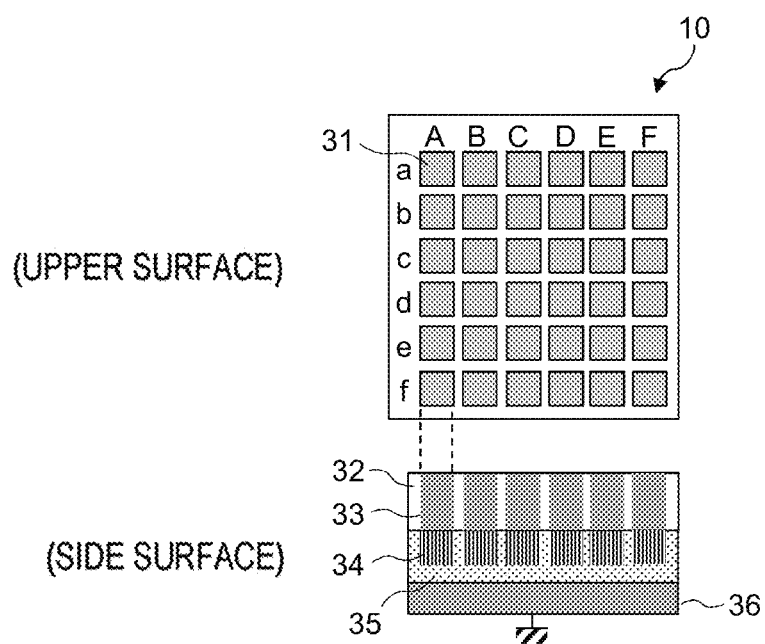
FIG. 2 shows a structural example of a position adjustment sample 10.

FIG. 2 shows a structural example of the position adjustment sample 10. In the position adjustment sample 10, a pattern 31 is repeatedly arranged in a grid shape when viewed from an upper surface, and pattern position coordinates can be recognized by marks. The pattern 31 is formed by electrodes. The position adjustment sample 10 includes, for example, a pn junction of a p-type semiconductor 34 and an n-type semiconductor 35 as an underlayer structure of the pattern. A side surface of each electrode 33 is covered with an insulating film 32 such as an oxide film. A semiconductor substrate 36 is made conductive at a ground electrode.

Figure 3:
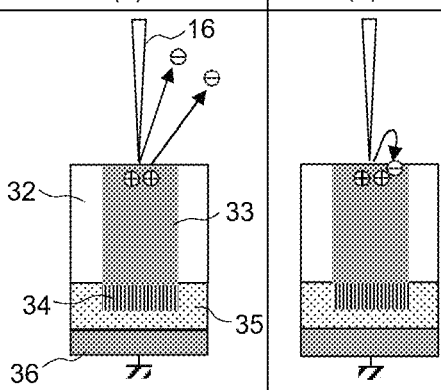
FIG. 3 shows an operation principle of the charged particle beam device 100.

FIG. 3 shows an operation of the charged particle beam device 100. In general, it is known that when a non-conductive sample is irradiated with an electron beam having low acceleration energy, the number of electrons emitted from the sample is larger than the number of incident electrons, and an electron emission rate is 1 or more. When an electron beam 16 having low acceleration energy is irradiated, the secondary electrons are emitted from the surface of the sample as shown in (a) in FIG. 3. At this time, since the electrodes on the surface are not conductive, surfaces of the electrodes are positively charged by the emission of the secondary electrons as shown in (b) in FIG. 3. A secondary electron image 37 at this time has a small brightness value and becomes a dark image.

When the position adjustment sample 10 has a pn junction structure in an underlayer, by irradiating a pn junction portion with light 17 having a wavelength range exceeding a band gap using the light source 8 and the adjustment mechanism 9, charged carriers are generated as shown in (c) in FIG. 3. The generated carriers act to cancel charges biased by positive charges on the electrode surface, and therefore, as shown in (d) in FIG. 3, the amount of the secondary electrons emitted by the electrode irradiated with the light increases again. A secondary electron image 38 at this time has a large brightness value and becomes a bright image. However, in a case of an electrode such as a gate electrode that does not have a pn junction in an underlayer, a charged state of a surface thereof does not particularly change even if the electrode is irradiated with light.

As described above, under a condition that the carriers are generated in the sample by light irradiation, the amount of the secondary electrons emitted changes due to a difference in potential states of the surface of the sample. Since an amount of the carriers generated by the light irradiation is determined by irradiation conditions of light, it is preferable to adjust an amount of light to an optimum amount such that the amount of the secondary electrons emitted changes by the light irradiation. It is preferable that a wavelength of the light to be irradiated is not only a wavelength that can excite the carriers of the pn junction, but also a penetration depth of the light and a transmittance to the surrounding insulating film are taken into consideration.

Figure 4:
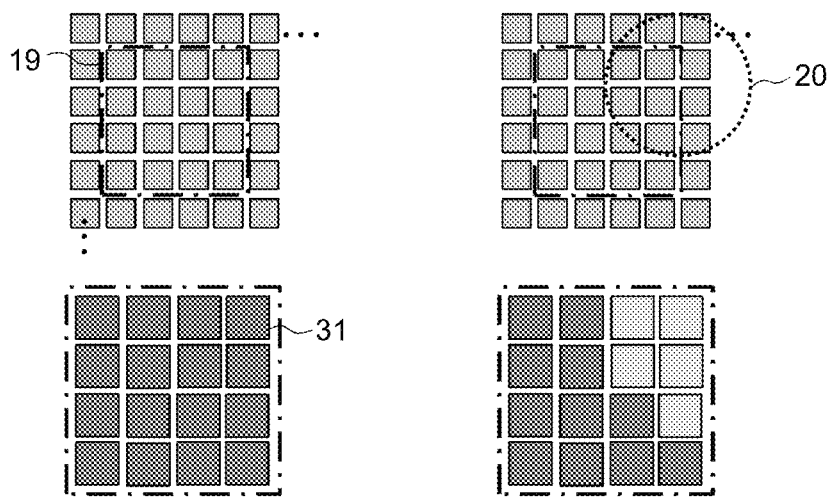
FIG. 4 is an example of a secondary electron image acquired by an image processing unit 14 based on a secondary electron signal.

FIG. 4 is an example of the secondary electron image acquired by the image processing unit 14 based on the secondary electron signal. (a) in FIG. 4 shows an image captured during a period when no light is irradiated. (b) in FIG. 4 shows an image captured during a period of irradiation with light. According to a principle described in FIG. 3, since a secondary electron image of a portion 20 irradiated with light has a high brightness value, an irradiation position of the light can be specified thereby.

Figure 5:
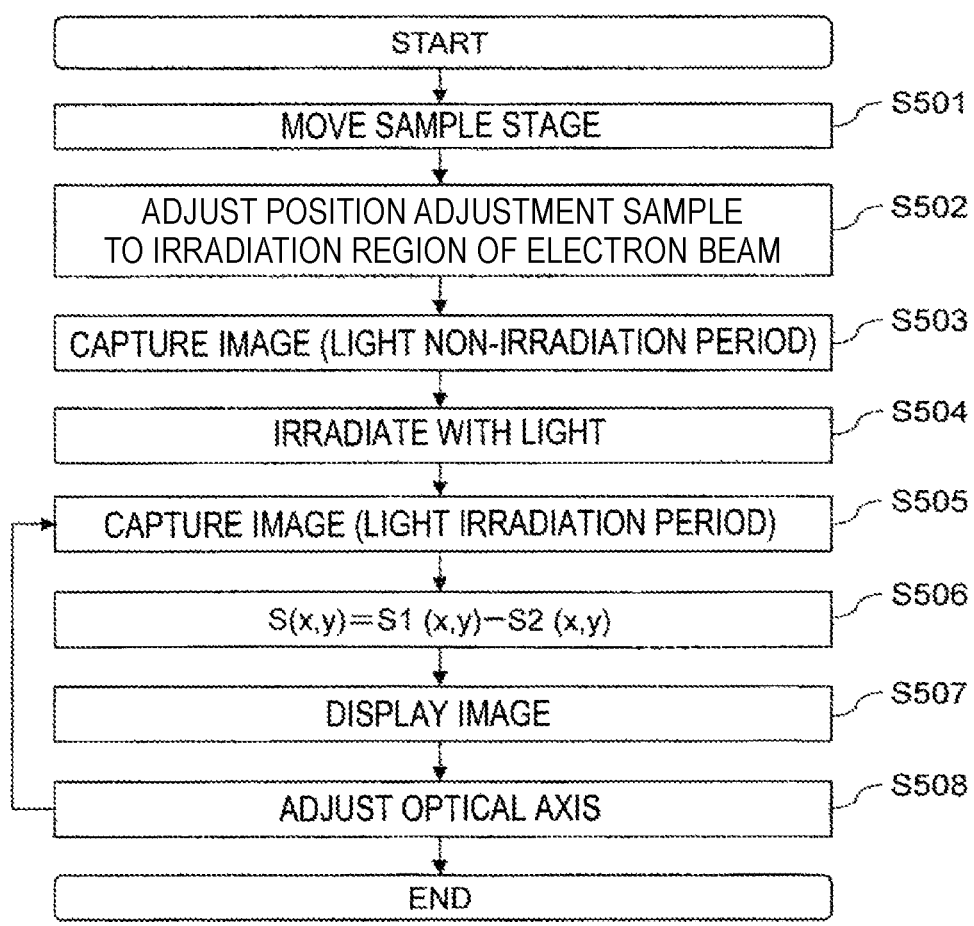
FIG. 5 is a flowchart illustrating an operation procedure of the charged particle beam device 100.

FIG. 5 is a flowchart illustrating an operation procedure of the charged particle beam device 100. The sample stage 6 is moved (S501), and the position adjustment sample 10 is placed in an irradiation region of the electron beam (S502). The image processing unit 14 acquires the secondary electron image using the secondary electron signal emitted from the position adjustment sample 10 when the position adjustment sample 10 is irradiated with the electron beam during the period when no light is irradiated on the position adjustment sample 10 (S503).

The light source 8 irradiates the position adjustment sample 10 with light (S504). The image processing unit 14 acquires the secondary electron image using the secondary electron signal emitted from the position adjustment sample 10 when the position adjustment sample 10 is irradiated with the electron beam during the period when no light is irradiated on the position adjustment sample 10 (S505).

As shown in FIG. 4, the irradiation position of the light can be specified according to the brightness of the secondary electron image. Therefore, by visually checking the secondary electron image, a user can adjust the adjustment mechanism 9 so that the irradiation position of the light and the irradiation position of the primary electron beam match. When a difference in brightness between the secondary electron image when irradiated with the light and the secondary electron image when not irradiated with the light is small and cannot be visually determined, the image processing unit 14 may acquire the difference between the two images by calculation. For example, by calculating a difference signal (S(x, y)) between a signal amount (S1($x, y$)) in a pixel (x, y) of the secondary electron image ((a) in FIG. 4) when not irradiated with the light, and a signal amount (S2($x, y$)) of the same pixel (x, y) in the secondary electron image ((b) in FIG. 4) when irradiated with the light, the difference in brightness can be determined (S506).

The image display unit 15 displays each secondary electron image (S507). When the difference signal S (x, y) is calculated, the difference signal or a difference signal image using the difference signal as a pixel value may also be displayed. While referring to the secondary electron images (and the difference signal S), the user adjusts the adjustment mechanism 9 so that the irradiation position of the light and the irradiation position of the primary electron beam match (S508).

In FIG. 5, the secondary electron image during the period when the light 17 is not irradiated is first acquired, and then the secondary electron image during the period when the light is irradiated is obtained. However, this order may be reversed. That is, this order may be any as long as a difference between the brightness value when the light 17 is not irradiated and the brightness value when the light 17 is irradiated is obtained.

Figure 6:
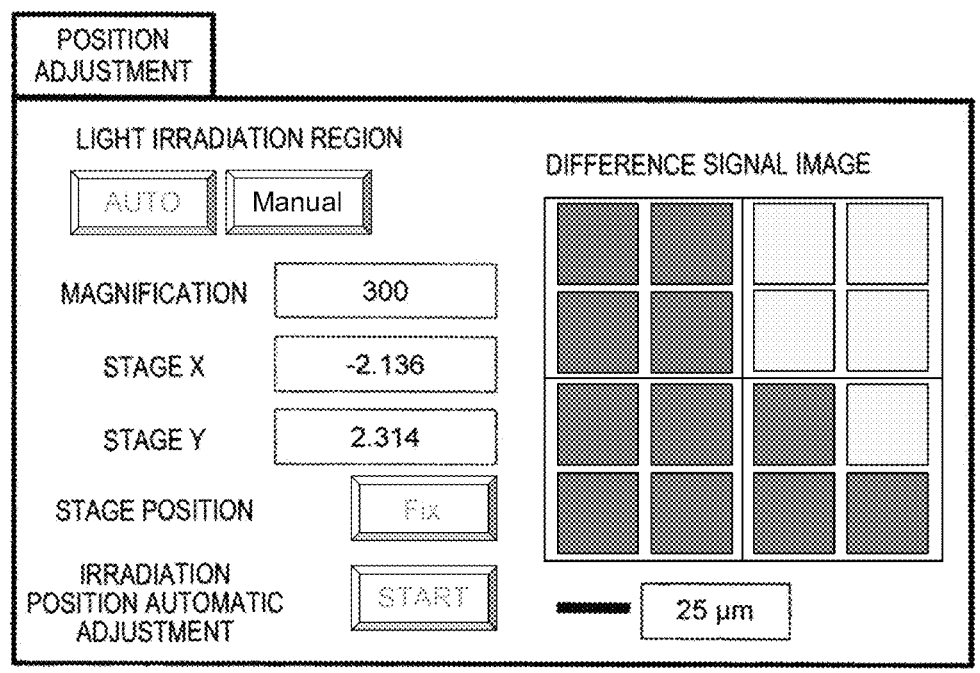
FIG. 6 is a diagram showing an example of a GUI used by a user to adjust an irradiation position of light.

FIG. 6 is a diagram showing an example of a graphic user interface (GUI) used by a user to adjust the irradiation position of the light. FIG. 6 shows an example when a part of the position adjustment sample 10 is irradiated with the light. When adjusting manually, an image generated from the difference signal is displayed in a right window, and a magnification of the secondary electron image and a stage position XY of the position adjustment sample 10 are displayed on a left side. A scale of the secondary electron image is displayed in conjunction with the magnification during observation. Irradiation position adjustment may be automated in an AUTO mode. When the AUTO mode is selected, a stage position Fix button for fixing the irradiation region of the electron beam and an observation region is activated. At this time, an irradiation position automatic adjustment button is also activated.

From the difference signal image on the screen of FIG. 6, the user can know whether the irradiation position of the electron beam 16 and the irradiation position of the light 17 match. That is, the difference signal image of FIG. 6 presents information suggesting whether the positions of the two match. The same information may be output in other forms. For example, the secondary electron images of steps S503 and S505 may be displayed in parallel.

First Embodiment: Overview

The charged particle beam device 100 according to the first embodiment obtains the information indicating whether the irradiation position of the primary electron beam and the irradiation position of the light match by obtaining the difference between the secondary electron image (first observation image) acquired when the primary electron beam is irradiated and the light is not irradiated and the secondary electron image (second observation image) acquired when the primary electron beam and the light are both irradiated. Therefore, it is possible to match the irradiation position of the primary electron beam with the irradiation position of the light by using a mechanism for forming an image of the secondary electrons without using a mechanism for forming an image of backscattered electrons. For example, in a general-purpose SEM (scanning electron microscope), an irradiation position of a primary electron beam and an irradiation position of light can be matched.

The charged particle beam device 100 according to the first embodiment can change the amount of secondary electrons emitted depending on whether the light is irradiated by using the position adjustment sample 10 having a pn junction as a lower structure of the electrode. Thereby, the brightness value of the secondary electron image at the position irradiated with the light can be distinguished from the other positions. Therefore, the irradiation position of the light can be clearly identified. The irradiation position of the light can be identified without using a mechanism for detecting backscattered electrons.

Second Embodiment

Figure 7:
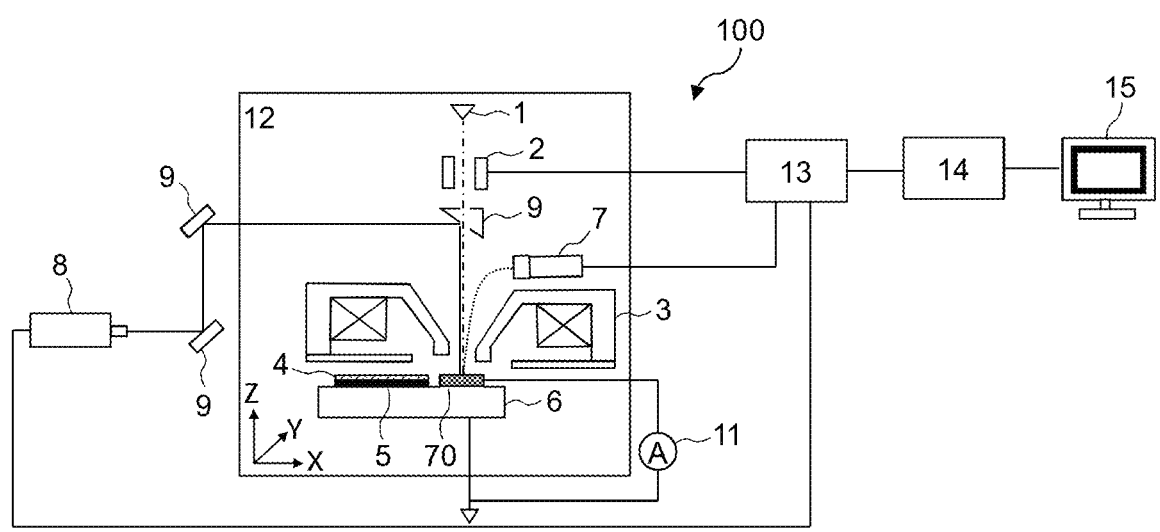
FIG. 7 is a configuration diagram of the charged particle beam device 100 according to a second embodiment.

FIG. 7 is a configuration diagram of the charged particle beam device 100 according to a second embodiment of the invention. In the second embodiment, a photodiode 70 is used instead of the position adjustment sample 10. The photodiode 70 converts an amount of light received into an electric signal and outputs the electric signal. The charged particle beam device 100 according to the second embodiment further includes an ammeter 11 (light amount measuring device). The ammeter 11 measures the electric signal output by the photodiode 70 as a current value, and outputs a measurement result. The ammeter 11 may be provided for each light receiving element of the photodiode 70, or the current value of each light receiving element may be measured by switching wiring of the ammeter 11. Other configurations are the same as those in the first embodiment.

As the photodiode 70, one whose sensitivity wavelength region matches a wavelength region of an electromagnetic wave oscillated from the light source 8 is used. When an amount of light incident on the photodiode 70 is large, an output of the light source 8 may be adjusted or an energy filter or the like may be provided in an optical path to change the amount of light so as to avoid element failure. Examples of a method for changing the amount of light include (a) changing an intensity of the light source 8, (b) providing an energy filter, (c) increasing the amount of light at a condensing position by condensing the light with a lens or the like, (d) adjusting the amount of light with a pinhole or variable aperture, or the like.

Figure 8:
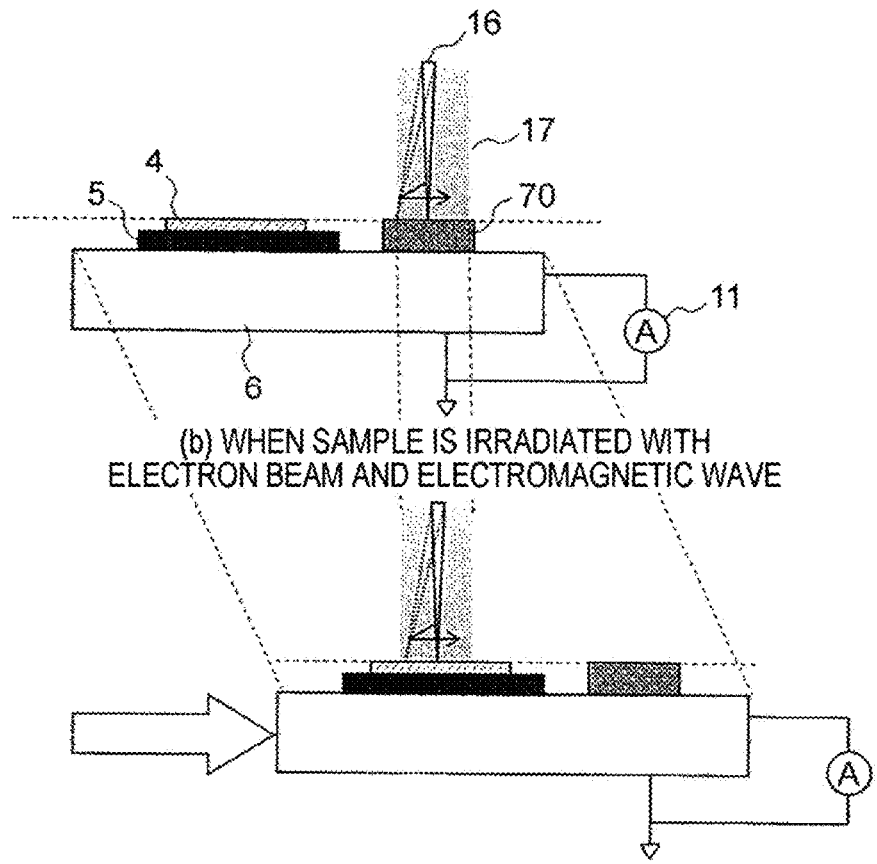
FIG. 8 is an enlarged diagram of an area around a sample stage 6.

FIG. 8 is an enlarged diagram of an area around the sample stage 6. Both the photodiode 70 and the sample 4 are mounted on the sample stage 6. If a height of a position where the light 17 is irradiated changes, a focal position of the light 17 changes, so that an element surface of the photodiode 70 matches a surface of the sample 4 in height. After irradiating the photodiode 70 with the electron beam 16 and the light 17 in an order to adjust the irradiation positions of both (an adjustment procedure will be described later) as shown in (a) in FIG. 8, by translating the sample stage 6 as shown in (b) in FIG. 8, the sample 4 can be measured by the electron beam 16 without changing the irradiation conditions of the light 17.

Figure 9:
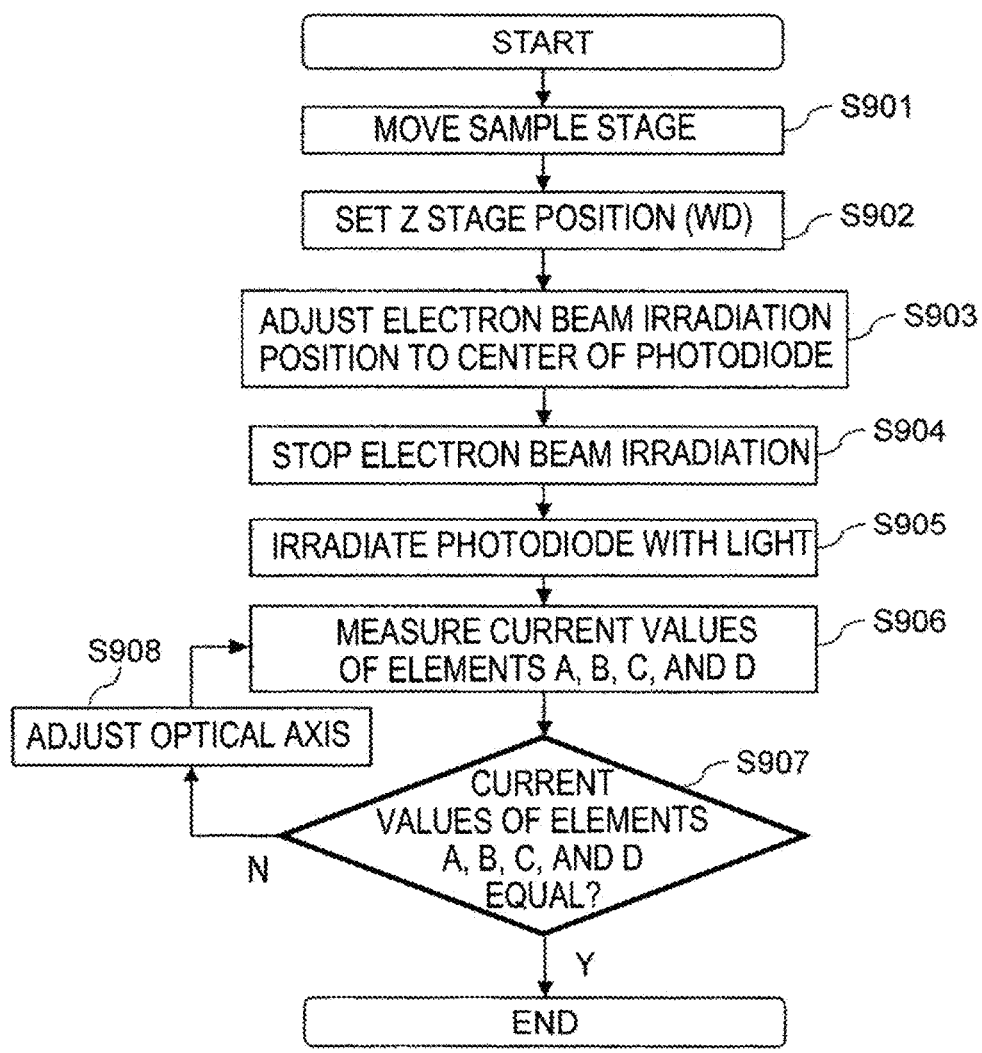
FIG. 9 is a flowchart illustrating an operation procedure of the charged particle beam device 100 according to the second embodiment.

FIG. 9 is a flowchart illustrating an operation procedure of the charged particle beam device 100 according to the second embodiment. The following matters are assumed in FIG. 9. A light spot of the light 17 is circular. The photodiode 70 includes four divided light receiving elements, and when current values output by the light receiving elements are equal to each other, a center of the photodiode 70 is irradiated with the light 17.

First, the sample stage 6 is moved (S901). In order to prevent the condensing position of the light 17 from changing due to the height of the surface of the photodiode 70, when observing a secondary electron image of the photodiode 70, the sample stage 6 is set in advance so as to make sure that a distance from an objective lens to the sample (Working Distance: WD) used in observation of the sample 4 matches the height of the surface of the photodiode 70 (S902).

The user adjusts the sample stage 6 so that the irradiation region of the electron beam 16 is at the center of the photodiode 70 while referring to the secondary electron image of the photodiode 70 displayed on the image display unit 15 (S903). After deciding a position of the sample stage 6, the irradiation of the electron beam 16 is stopped (S904). In order to maintain stable irradiation, it is desirable to stop the irradiation of the electron beam 16 by inserting a shield or a deflection voltage instead of stopping the electron source 1.

The light 17 is oscillated from the light source 8 to irradiate the photodiode 70 (S905). Each light receiving element converts the amount of light received into the electric signal, and the ammeter 11 measures the current value flowing through each light receiving element (S906). If the current values of the light receiving elements are equal (S907: Y), the irradiation position of the electron beam 16 and the irradiation position of the light 17 are considered to be the same, and this flowchart ends. If the current values of the light receiving elements are not equal (S907: N), the user adjusts an optical axis of the light 17 using the adjustment mechanism 9 (S908). S906 to S909 are repeated until the current values of the light receiving elements become equal.

Figure 10:
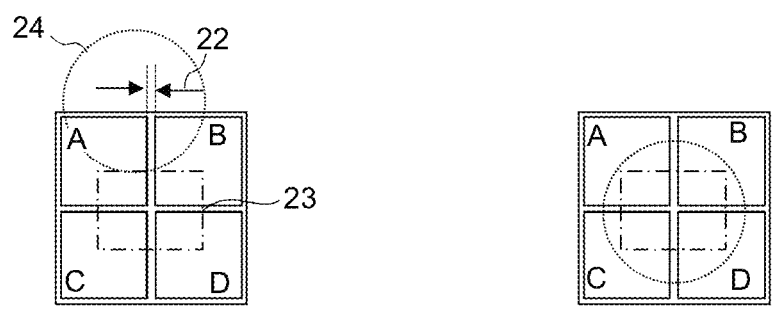
FIG. 10 is an image diagram illustrating a process of adjusting an irradiation position.

FIG. 10 is an image diagram illustrating a process of adjusting the irradiation position. The photodiode 70 is divided into four light receiving elements A to D, and the ammeter 11 measures the current value flowing through each of the light receiving elements A to D. A slit 22 is provided between two adjacent light receiving elements, and it is assumed that the light spot of the light 17 has a light diameter larger than a dimension of the slit 22.

As shown in (a) in FIG. 10, when the irradiation region 23 of the electron beam and the irradiation region 24 of the light do not match, since the amounts of light received by the light receiving elements are not equal to each other, magnitudes of the current values are indicated by, for example, a relationship of A>B>C=D=0. After performing the flow of FIG. 9 and adjusting the irradiation position, as shown in (b) in FIG. 10, the amounts of light received by the light receiving elements become equal, and the magnitude relationship of the current values is A=B=C=D.

When the light to be irradiated is in a shape of an ellipse, a first dividing line that divides the ellipse into two makes current values of two divided regions equal. In a case of FIG. 10, for example, the sample stage 6 is moved such that a sum of the current values of light receiving elements A, C (A+C) and a sum of the current values of light receiving elements B, D (B+D) are equal, and then a position of the photodiode 70 is adjusted in a certain uniaxial direction. Next, in order to determine a second dividing line that is orthogonal to the first dividing line, the sample stage 6 is moved such that a sum of the current values of light receiving elements A, B (A+B) and a sum of the current values of light receiving elements C, D (C+D) are equal, and then the position of the photodiode 70 is adjusted. At this time, the current values of the elements that are positioned diagonally become equal (A=D, B=C), and an intersection of the diagonal lines is defined as a center of the irradiation position of the light to determine the irradiation position of the light.

When the user adjusts the position of the photodiode 70, information assisting work thereof may be output by displaying the information on the image display unit 15. For example, by displaying the current values of the light receiving elements A to D, it is possible to identify in which direction the irradiation position of the light 17 is biased. Other appropriate information may suggest whether the irradiation position of the electron beam 16 and the irradiation position of the light 17 match.

Second Embodiment: Overview

The charged particle beam device 100 according to the second embodiment adjusts the irradiation position of the electron beam 16 by using the secondary electron image of the photodiode 70, and also adjusts the irradiation position of the light 17 by using the measurement result of the amount of the light 17 by the photodiode 70. Therefore, it is possible to match the irradiation position of the primary electron beam with the irradiation position of the light by using a mechanism for forming an image of the secondary electrons without using a mechanism for forming an image of backscattered electrons. For example, in a general-purpose SEM (scanning electron microscope), an irradiation position of a primary electron beam and an irradiation position of light can be matched.

Third Embodiment

Figure 11:
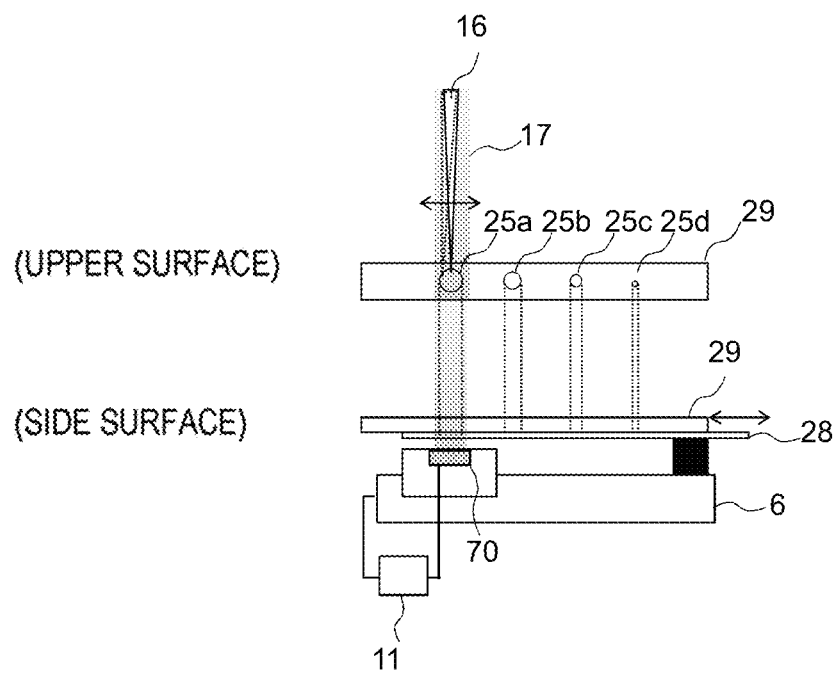
FIG. 11 is a diagram showing a configuration of a movable aperture plate 29 provided in the charged particle beam device 100 according to a third embodiment.

FIG. 11 is a diagram showing a configuration of a movable aperture plate 29 provided in the charged particle beam device 100 according to a third embodiment of the invention. In the third embodiment, a support base 28 is fixed to the sample stage 6, and the movable aperture plate 29 is fixed to the support base 28. The movable aperture plate 29 can change a size of an aperture holes 25 through which the light 17 passes. For example, by providing a plurality of aperture holes 25 having different sizes as a hole 25a, a hole 25b, a hole 25c, and a hole 25d in a descending order of size as shown in FIG. 11 and moving a main body of the movable aperture plate 29, the aperture hole 25 of any size can be selected. Alternatively, the size of the aperture hole 25 itself may be variable. The light 17 that passes through the aperture hole 25 is detected by the photodiode 70 located below the aperture hole 25, and the amount of light is measured by the ammeter 11.

The photodiode 70 may be one or may be arranged under each aperture hole 25. When there is one photodiode 70, the movable aperture plate 29 can move with reference to the support base 28. Instead of the photodiode 70, other elements capable of detecting the light 17 may be used. For example, a thermal sensor, an energy sensor, or the like can be used. Instead of the ammeter 11, other measuring instruments capable of measuring the amount of light can also be used. For example, a power meter or the like can be used. The same applies to a configuration example of FIG. 13 to be described later. In the following, for convenience of explanation, the photodiode 70 and the ammeter 11 will be used as shown in FIG. 11. Other configurations are the same as those in the second embodiment.

Figure 12:
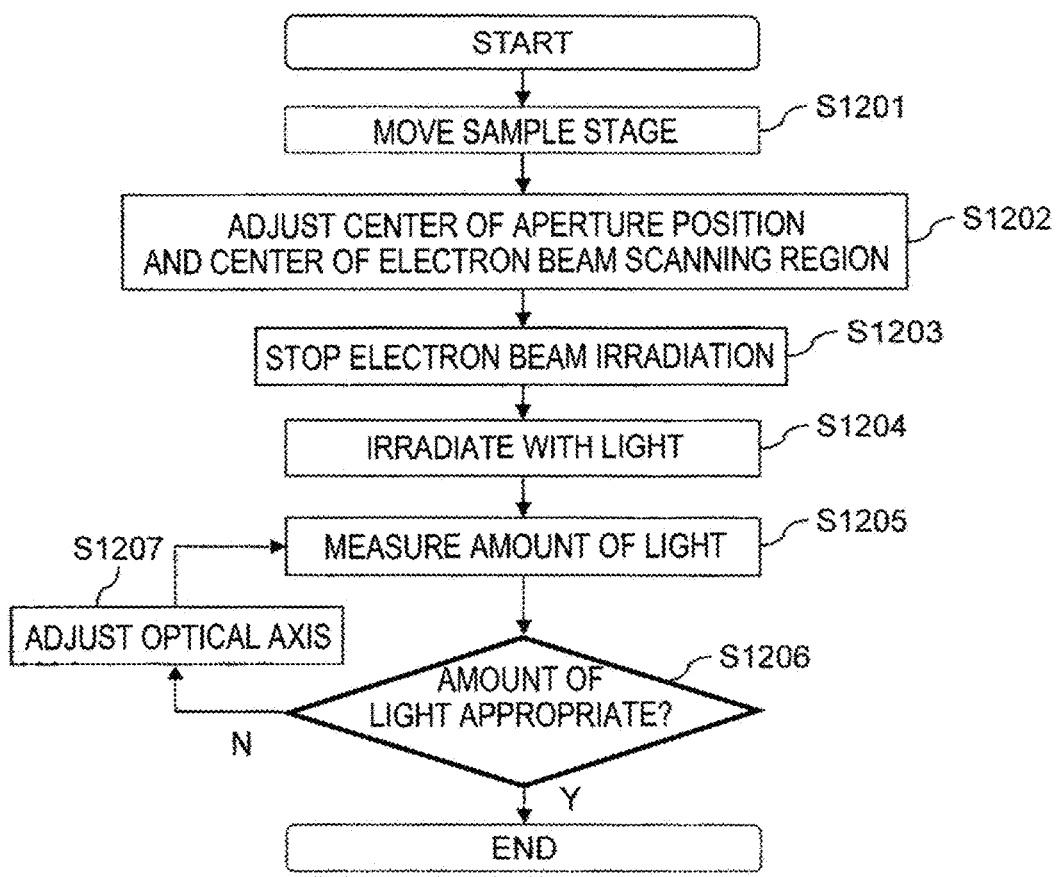
FIG. 12 is a flowchart illustrating an operation procedure of the charged particle beam device 100 according to the third embodiment.

FIG. 12 is a flowchart illustrating an operation procedure of the charged particle beam device 100 according to the third embodiment. First, the sample stage 6 is moved (S1201), and the user matches a center of the aperture hole 25 with a center of a scanning region of the electron beam 16 while referring to the secondary electron image displayed on the image display unit 15 (S1202). After deciding the position of the sample stage 6, the irradiation of the electron beam 16 is stopped (S1203).

The light 17 is oscillated from the light source to irradiate the aperture hole 25 (S1204). The light 17 that passes through the aperture hole 25 is detected by the photodiode 70, and the amount of light is measured by the ammeter 11 (S1205). The user determines whether the amount of light is appropriate (S1206). If the amount of light is an appropriate value (S1206: Y), the irradiation position of the electron beam 16 and the irradiation position of the light 17 are considered to be appropriate (match), and this flowchart ends. If the amount of light is insufficient (S1206: N), the user adjusts the optical axis by the adjustment mechanism 9 (S1207). Whether the amount of light is an appropriate value may be determined by grasping a correspondence relationship between an aperture diameter of the aperture hole 25 and a range of appropriate amount of light in advance and following the relationship, for example.

When there are the plurality of aperture holes 25, it is desirable to simply adjust the amount of light by first performing the flowchart of FIG. 12 for the aperture hole 25a having the largest hole diameter. When the light is condensed or when it is desired to reduce the amount of light to be irradiated, the flowchart of FIG. 12 is performed on the aperture hole 25b having a smaller hole diameter. By repeating this process for the further smaller aperture holes 25c and 25d, the irradiation position of the light can be accurately determined.

Figure 13:
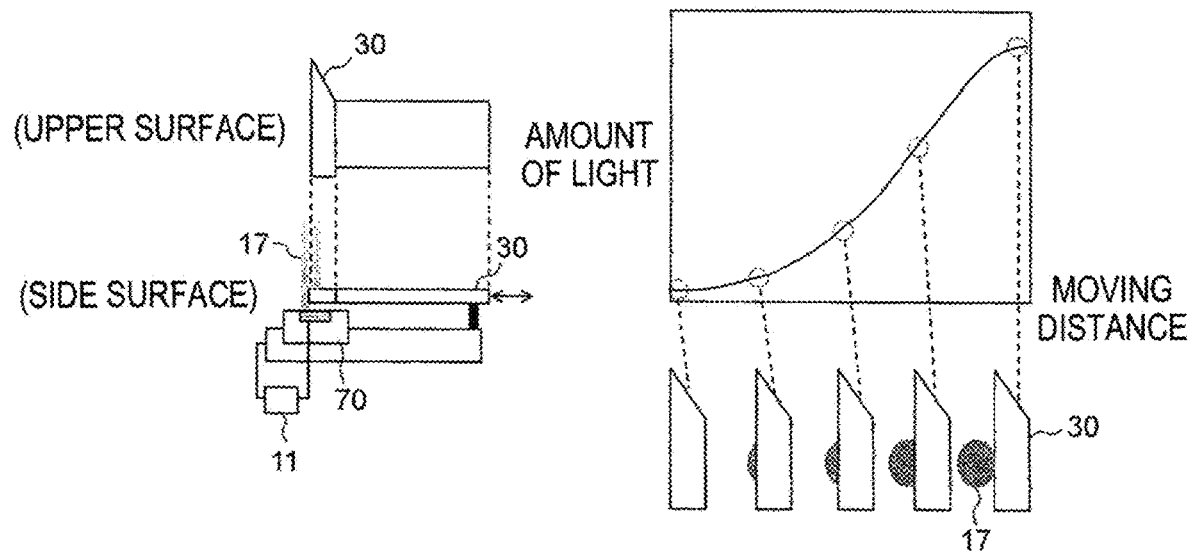
FIG. 13 shows a configuration example in which a light-shielding plate 30 is provided instead of the movable aperture plate 29.

FIG. 13 shows a configuration example in which a light-shielding plate 30 is provided instead of the movable aperture plate 29. By moving the light-shielding plate 30 in XYZ directions, an area in which the light 17 is shielded can be changed. For example, as shown in FIG. 13, the light-shielding plate 30 formed in a knife edge shape can be used. The photodiode 70 is arranged below the light-shielding plate 30, and an amount of light that reaches the photodiode 70 without being shielded by the light-shielding plate 30 is measured.

When the amount of light measured by the ammeter 11 is plotted against a moving distance of the light-shielding plate 30, an intensity distribution such as Gaussian is measured, and the light diameter can be obtained by any definition such as a full width half maximum (FWHM). When the shape of the light spot is elliptical, it is necessary to measure the amount of light in each of a major axis direction and a minor axis direction. Even when the light-shielding plate 30 is used, a correspondence relationship between an appropriate amount of light and a light-shielding area can be used as in FIG. 12.

Figure 14:
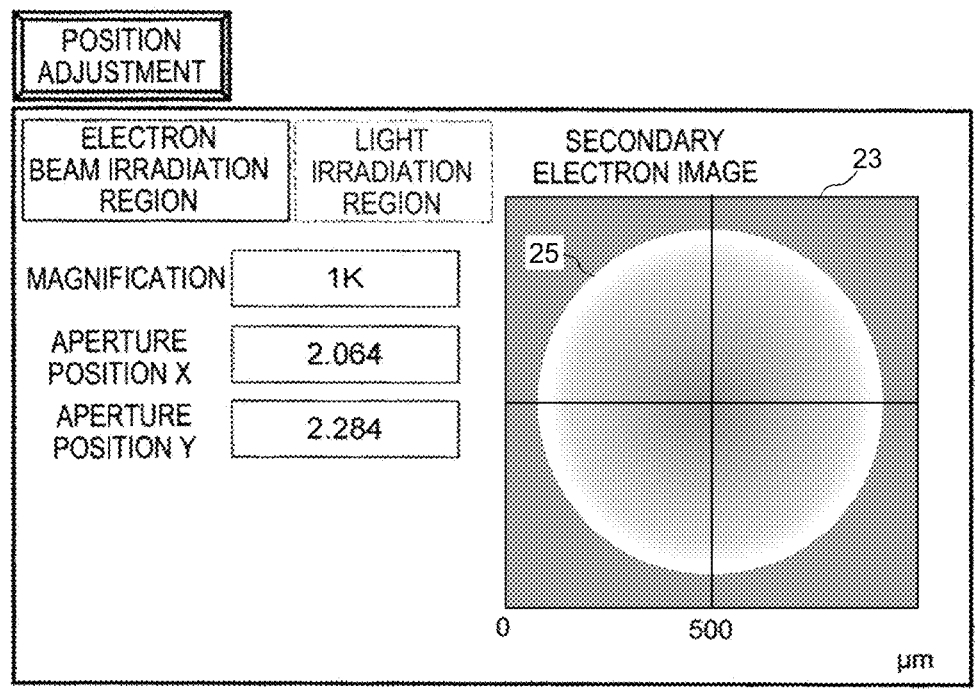
FIG. 14 is an operation screen when an irradiation region 23 of an electron beam is matched with a center of an aperture hole 25.

FIG. 14 is an operation screen when the irradiation region 23 of the electron beam is matched with the center of the aperture hole 25. When the sample stage 6 is moved so that the center of the irradiation region 23 of the electron beam comes to the center of the aperture hole 25 while observing a secondary electron image, a circular aperture is observed as the secondary electron image. On a left side of the screen, as observation conditions for the secondary electron beam at this time, a magnification, a relative position X and a relative position Y of the sample stage are displayed in conjunction with the secondary electron image. A scale of the secondary electronic image fluctuates according to the magnification selected on the left side of the screen. Therefore, the diameter of the aperture hole 25 being observed can be grasped.

Figure 15:
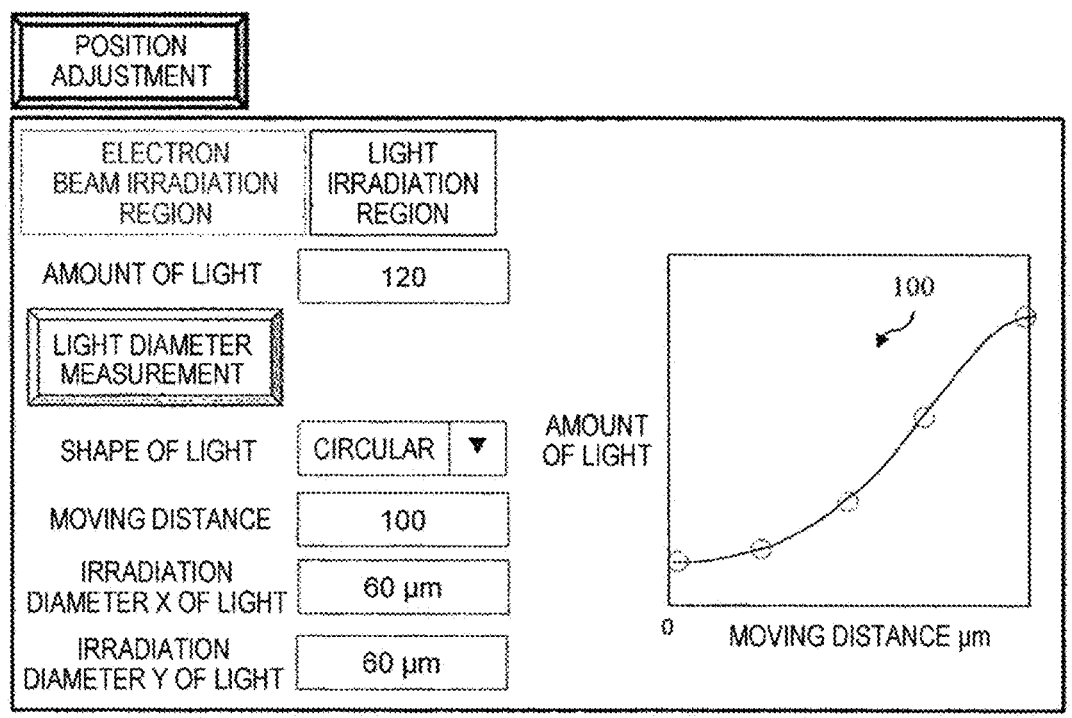
FIG. 15 is an operation screen for adjusting an optical axis while measuring an amount of light passing through the aperture hole 25.

FIG. 15 is an operation screen for adjusting an optical axis while measuring an amount of light passing through the aperture hole 25. This operation screen displays the amount of light measured by the ammeter 11 in real time. The user operates so that the amount of light is appropriate while adjusting the position of the mirror. When measuring the light diameter using the light-shielding plate 30, the shape, a moving distance, and an irradiation diameter X and an irradiation diameter Y of the light are activated. The amount of light measured by the ammeter 11 corresponding to the moving distance of the light-shielding plate 30 is plotted and displayed in a right window. The amount of light displayed on this screen can be used as information indicating whether the irradiation position of the electron beam 16 and the irradiation position of the light 17 match.

Third Embodiment: Overview

In the charged particle beam device 100 according to the third embodiment, after matching the irradiation position of the electron beam 16 with the movable aperture plate 29 or the light-shielding plate 30, the irradiation position of the light 17 is matched with the irradiation position of the electron beam 16 based on whether the amount of light is appropriate. Therefore, even when the light is irradiated to a larger region than the case of using the photodiode 70 described in the second embodiment, the irradiation positions can be easily matched.

Forth Embodiment

Figure 16:
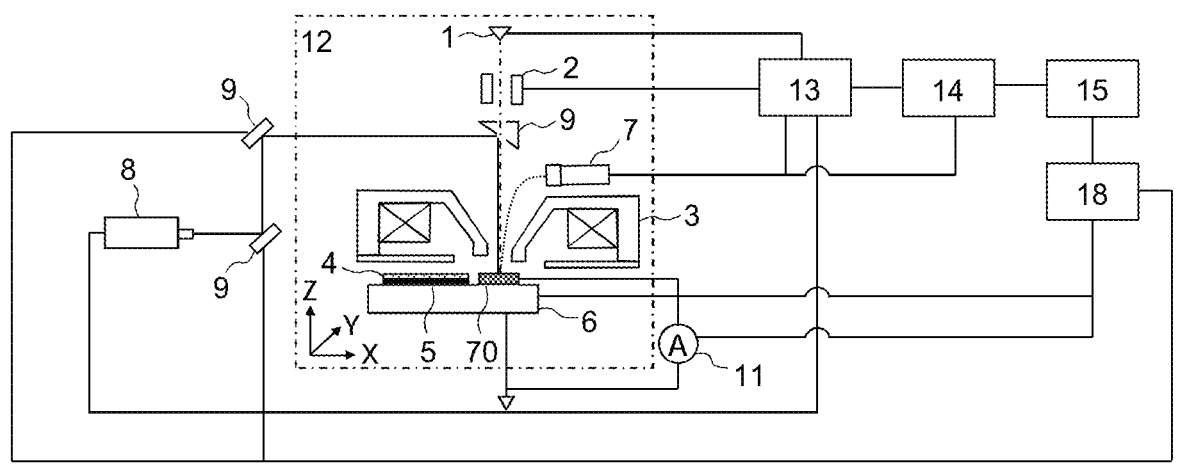
FIG. 16 is a configuration diagram of the charged particle beam device 100 according to a forth embodiment.

FIG. 16 is a configuration diagram of the charged particle beam device 100 according to a forth embodiment of the invention. In the fourth embodiment, the irradiation position of the light 17 is automatically matched with the irradiation position of the electron beam 16. Hereinafter, an example including a light irradiation mechanism control unit 18 in addition to the configurations described in the second embodiment will be described.

The light irradiation mechanism control unit 18 controls the adjustment mechanism 9 according to the value measured by the ammeter 11 so as to match the irradiation position of the light 17 with the irradiation position of the electron beam 16. Specifically, after matching the irradiation position of the electron beam 16 with the center of the photodiode 70, the adjustment mechanism 9 is controlled so that the center of the photodiode 70 is irradiated with the light 17. The light irradiation mechanism control unit 18 controls the adjustment mechanism 9 by adjusting the position and an angle of the mirror using, for example, an electric actuator. A specific control procedure will be described later.

Figure 17:
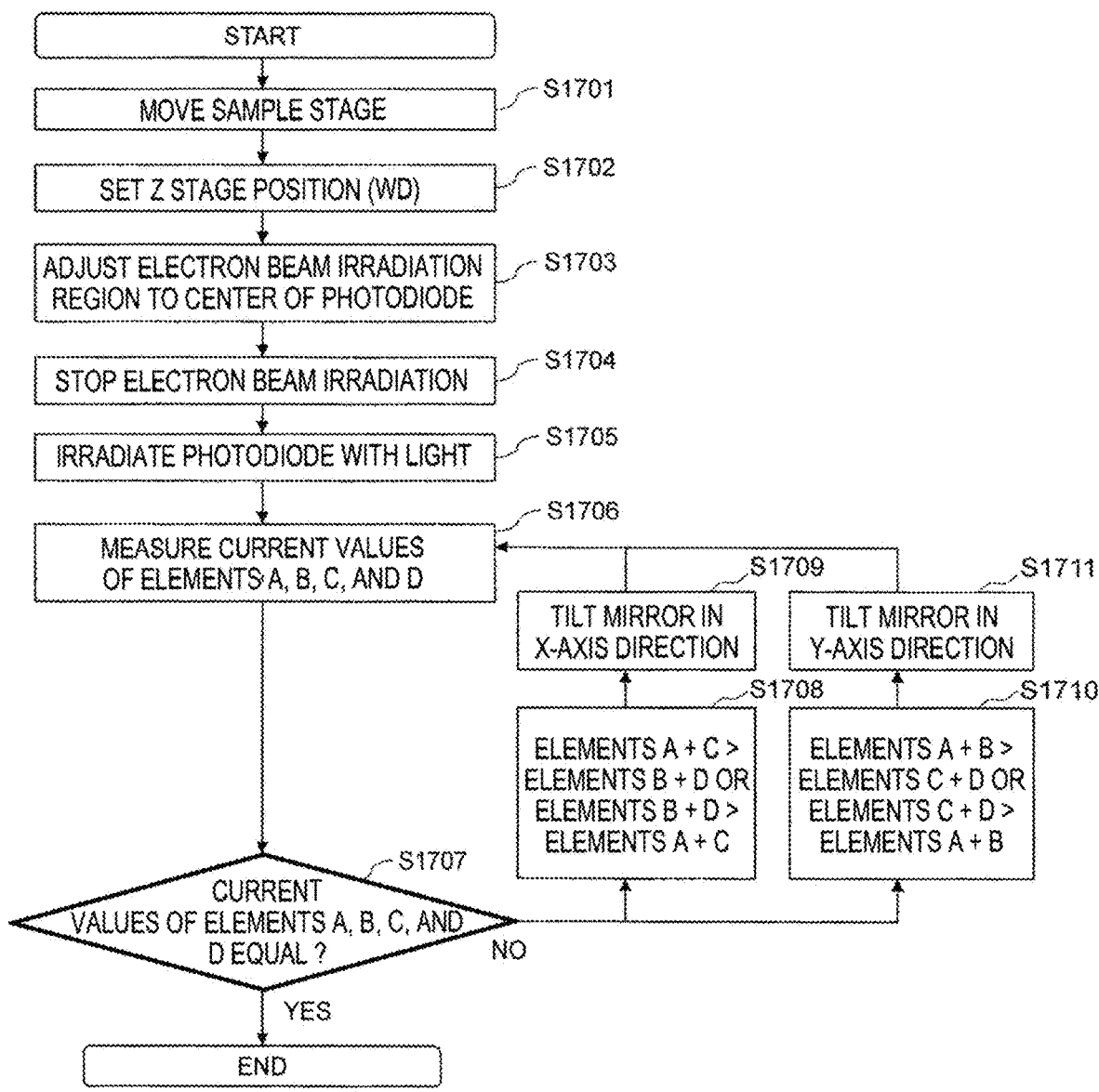
FIG. 17 is a flowchart illustrating an operation procedure of the charged particle beam device 100 according to the forth embodiment.

FIG. 17 is a flowchart illustrating an operation procedure of the charged particle beam device 100 according to the forth embodiment. Since steps S1701 to S1707 are the same as steps S901 to S907 in FIG. 9, steps S1708 and subsequent steps will be described below. If the current values of the light receiving elements are not equal in step S1707, steps S1708 to S1709 are carried out or steps S1710 to S1711 are carried out according to the following classifications.

When a total current value flowing through the light receiving element A and the light receiving element C is larger than a total current value flowing through the light receiving element B and the light receiving element D (S1708), the light 17 is tilted toward sides of the light receiving elements A and C. Therefore, the light irradiation mechanism control unit 18 moves a tilt angle of the mirror in an X-axis direction to tilt the light 17 toward sides of the light receiving elements B and D (S1709). When the total current value of the light receiving elements B and D is larger than the total current value of the light receiving elements A and C, the light 17 is similarly tilted toward the sides of the light receiving elements A and C.

When a total current value flowing through the light receiving element A and the light receiving element B is larger than a total current value flowing through the light receiving element C and the light receiving element D (S1710), the light 17 is tilted toward sides of the light receiving elements A and B. Therefore, the light irradiation mechanism control unit 18 moves the tilt angle of the mirror in a Y-axis direction to tilt the light 17 toward the sides of the light receiving elements C and D (S1711). When the total current value of the light receiving elements C and D is larger than the total current value of the light receiving elements A and B, the light 17 is similarly tilted toward the sides of the light receiving elements A and B.

Even when the position adjustment sample 10 described in the first embodiment is used, the irradiation position of the light 17 can be automatically adjusted by the light irradiation mechanism control unit 18 performing the following procedure. When a secondary electron image of the position adjustment sample 10 is acquired while the position adjustment sample 10 is irradiated with the light 17, bright and dark parts are generated as described in FIG. 4. By detecting a boundary between the two parts on the image, a direction to which the irradiation position of the light 17 should be moved can be known. For example, when a secondary electron image as shown in (b) in FIG. 4 is obtained, since a center position of the light 17 can be estimated by regarding the boundary as a part of an arc, it is possible to obtain a vector by which the center position is moved to a center of the position adjustment sample 10. The light irradiation mechanism control unit 18 controls the adjustment mechanism 9 so as to adjust the irradiation position of the light 17 according to the movement vector.

In a case where the position adjustment sample 10 described in the first embodiment is used, when the irradiation position of the light 17 is fixed and the irradiation position of the electron beam 16 is automatically adjusted, the light irradiation mechanism control unit 18 performs the following procedure. The center position of the light 17 is estimated by detecting the boundary between the dark part and the bright part of the position adjustment sample 10, and the deflector 2 or the sample stage 6 is driven so that the center position and the center of the position adjustment sample 10 match with each other. If fine adjustment is required, the adjustment mechanism 9 may be used as an auxiliary.

Even when the movable aperture plate 29 or the light-shielding plate 30 described in the third embodiment is used, the light irradiation mechanism control unit 18 can automatically adjust the irradiation position of the light 17 so that the amount of light becomes appropriate. For example, by scanning the irradiation position of the light 17 around the aperture hole 25, it is possible to search for an irradiation position where an appropriate amount of light can be obtained.

Forth Embodiment: Overview

The charged particle beam device 100 according to the fourth embodiment can automatically adjust the irradiation position of the light 17 by calculating the irradiation position of the light 17 with respect to the position adjustment sample 10 or the photodiode 70. Accordingly, the irradiation position of the light 17 can be automatically adjusted by, for example, remote control.

<Modifications of Invention>

The invention is not limited to the embodiments described above, and includes various modifications. For example, the embodiments described above has been described in detail for easy understanding of the invention, and the invention is not necessarily limited to those including all configurations described above. A part of a configuration of an embodiment can be replaced with a configuration of another embodiment, or a configuration of another embodiment can be added to the configuration of the embodiment. It is possible to add, delete, and replace other configurations for a part of the configurations of each embodiment.

In the above embodiments, the configuration example in which the invention is applied to a general-purpose scanning electron microscope (SEM) has been described, but the invention can also be used in other charged particle beam devices. For example, it is conceivable to apply the invention to a focused ion beam device.

In the above embodiments, it is assumed that position deviation of the electron beam 16 is on an order of nm, position deviation of the light 17 is on an order of $\mu m$ to mm, and sizes of the position adjustment sample 10 and the sample 4 are on an order of mm, but the invention is not limited to these and can be applied to sizes other than these.

In the first embodiment, it has been described that the brightness difference of the secondary electron image between the period when the light 17 is irradiated and the period when the light 17 is not irradiated is used. If the brightness difference is caused by changing the amount and energy of the light 17, the same procedure as in the first embodiment can be performed without necessarily turning off the light 17 completely. That is, the irradiation position of the light 17 may be specified according to the brightness values of the secondary electron image between the period when the amount and energy of the light 17 are large and the period when they are both small.

In the second embodiment, when the photodiode 70 is irradiated with the light 17, it is possible to obtain a more accurate measurement result by stopping the electron beam 16, but the invention is not necessarily limited to this. This is because if it is known that the current values of the light receiving elements A to D are equal regardless of presence or absence of the electron beam 16, it can be determined that the irradiation position of the light 17 matches with the center of the photodiode 70.

REFERENCE SIGN LIST 1 electron source
2 deflector
3 electron lens
4 sample
5 sample holder
6 sample stage
7 secondary electron detector
8 light source
9 adjustment mechanism
10 position adjustment sample
11 ammeter
12 vacuum chamber
13 control unit
14 image processing unit 15 image display unit
16 electron beam
17 light
22 slit
25 aperture hole
27 light amount measuring device
28 support base
29 movable aperture plate
30 light-shielding plate
31 pattern
32 insulating film
33 electrode
34 p-type semiconductor
35 n-type semiconductor
36 semiconductor substrate
37 secondary electron image
38 secondary electron image
70 photodiode

The invention claimed is:

1. A charged particle beam device, comprising:
a charged particle source configured to irradiates a sample with a primary charged particle beam;
a sample stage on which the sample is placed;
a detector configured to detect secondary charged particles emitted from the sample by irradiating the sample with the primary charged particle beam;
an image processing unit configured to acquire an observation image of the sample based on the secondary charged particles detected by the detector; and
a light source configured to irradiate the sample with light, wherein
the image processing unit acquires a first observation image of the sample based on the secondary charged particles detected by the detector in a first period when the sample is irradiated with the primary charged particle beam and not irradiated with the light,
the image processing unit acquires a second observation image of the sample based on the secondary charged particles detected by the detector during a second period when the sample is irradiated with the light and irradiated with the primary charged particle beam, and
the image processing unit outputs irradiation position information suggesting whether an irradiation position of the primary charged particle beam and an irradiation position of the light on the sample match by calculating a difference between the first observation image and the second observation image.

2. The charged particle beam device according to claim 1, further comprising:
an image display unit configured to display the observation image acquired by the image processing unit, wherein
the image display unit displays at least one of the first observation image, the second observation image, and a difference image indicating the difference between the first observation image and the second observation image.

3. The charged particle beam device according to claim 1, wherein
the image processing unit specifies the irradiation position of the light on the sample based on a difference between a signal amount of each pixel of the first observation image and a signal amount of each pixel of the second observation image.

4. The charged particle beam device according to claim 1, further comprising:
an adjustment mechanism configured to move the irradiation position of the light with respect to the sample, wherein
the adjustment mechanism adjusts the irradiation position of the light by a mirror or a condenser lens with reference to the irradiation position of the primary charged particle beam.

5. The charged particle beam device according to claim 4, comprising:
a deflector configured to deflect the primary charged particle beam, wherein
the mirror is arranged between the deflector and the sample stage,
the mirror includes a hole through which the primary charged particle beam passes, and
the mirror is made of a non-magnetic conductor material.

6. The charged particle beam device according to claim 1, wherein
an adjustment sample used to specify the irradiation position of the light is placed on the sample stage,
the adjustment sample has a pattern of a plurality of electrodes on a semiconductor substrate, and has a PN junction structure including a P-type semiconductor and an N-type semiconductor in an underlayer structure of the pattern,
the image processing unit acquires an observation image of the adjustment sample as the first observation image, and then acquires an observation image of the adjustment sample as the second observation image, and
the image processing unit outputs, as the irradiation position information, information indicating a portion of the second observation image having a higher brightness value than that of the first observation image.

7. The charged particle beam device according to claim 6, wherein
energy of the light is higher than band gap energy of the adjustment sample and lower than a work function of the adjustment sample.

8. The charged particle beam device according to claim 6, wherein
a side surface of each electrode is covered with an insulating film.

9. The charged particle beam device according to claim 1, further comprising:
an adjustment mechanism configured to adjust the irradiation position of the light; and
an adjustment mechanism control unit configured to control the adjustment mechanism, wherein
the adjustment mechanism control unit matches the irradiation position of the primary charged particle beam with the irradiation position of the light on the sample by controlling the adjustment mechanism so that the difference becomes small.

10. A charged particle beam device, comprising:
a charged particle source configured to irradiate an object with a primary charged particle beam;
a sample stage on which the object is placed;
a detector configured to detect secondary charged particles emitted from the object by irradiating the object with the primary charged particle beam;
an image processing unit configured to acquire an observation image of the object based on the secondary charged particles detected by the detector;
a light source configured to irradiate the object with light; and
a light amount measuring device configured to measure an amount of the light irradiated to the object, wherein the image processing unit acquires an observation image of the object based on the secondary charged particles detected by the detector in a period when the object is irradiated with the primary charged particle beam and not irradiated with the light, and the image processing unit outputs irradiation position information suggesting whether an irradiation position of the primary charged particle beam and an irradiation position of the light on the object match using the observation image and a measurement result by the light amount measuring device.

11. The charged particle beam device according to claim 10, wherein the object is made of a photodiode, the light amount measuring device is an ammeter configured to measure a current output by the photodiode, the photodiode includes a photodiode element that is centrally symmetrical and divided into a plurality of regions having an equal area, a slit is provided between two adjacent photodiode elements, the light source emits the light having a light diameter equal to or larger than a size of the slit, and each of the photodiode elements outputs a current indicating an amount of incident light.

12. The charged particle beam device according to claim 11, further comprising:

a deflector configured to deflect the primary charged particle beam, wherein the deflector deflects the primary charged particle beam so that a center of the photodiode is irradiated with the primary charged particle beam, and the image processing unit outputs the irradiation position information using the observation image when the center of the photodiode is irradiated with the primary charged particle beam and the measurement result by the light amount measuring device.

13. The charged particle beam device according to claim 11, further comprising:

an adjustment mechanism configured to adjust the irradiation position of the light; and an adjustment mechanism control unit configured to control the adjustment mechanism, wherein the adjustment mechanism control unit matches the irradiation position of the primary charged particle beam with the irradiation position of the light on the object by controlling the adjustment mechanism so that the currents output by the photodiode elements are equal.

14. The charged particle beam device according to claim 10, further comprising:

an aperture plate arranged between the light source and the light amount measuring device and provided with an aperture hole through which the light passes; and a light amount control unit configured to control an amount of light emitted by the light source, wherein the light amount control unit adjusts the amount of light emitted by the light source depending on whether an amount of the light passing through the aperture hole is within a predetermined range corresponding to an opening diameter of the aperture hole.

15. The charged particle beam device according to claim 10, further comprising:

a light-shielding plate arranged between the light source and the light amount measuring device and configured to block the light, the light-shielding plate being configured to change an area in which the light is blocked; and a light amount control unit configured to control an amount of light emitted by the light source, wherein the light amount control unit adjusts the amount of light emitted by the light source depending on whether an amount of light passing through the light-shielding plate is within a predetermined range corresponding to the area of the light that is blocked by the light-shielding plate.

\* \* \* \* \*